United States Patent [19]

Reinhold

[11] Patent Number: 4,973,543

[45] Date of Patent: Nov. 27, 1990

[54] SYSTEM FOR THE PRODUCTION OF DOT-ETCHED LITHOGRAPHIC FILMS

[75] Inventor: Rüger Reinhold, Rodermark, Fed. Rep. of Germany

[73] Assignee: E. I. du Pont de Nemours and Company, Wilmington, Del.

[21] Appl. No.: 233,536

[22] Filed: Aug. 18, 1988

[30] Foreign Application Priority Data

Oct. 29, 1987 [DE] Fed. Rep. of Germany ....... 3736645

[51] Int. Cl.$^5$ .............................................. G03C 1/06
[52] U.S. Cl. ................................... 430/264; 430/302; 430/310
[58] Field of Search ............... 430/264, 305, 309, 310, 430/292

[56] References Cited

FOREIGN PATENT DOCUMENTS 0017123 2/1980 Japan ................................... 430/264

*Primary Examiner*—Jose Dees
*Assistant Examiner*—Jackie Weddington

[57] ABSTRACT

A system for the preparation of dot etched lithographic films, consisting essentially of a light sensitive silver halide material for tanning development and an etching solution, in which system the light sensitive material of various layers contains at least one colorant, e.g., pigment or dye with acid groups, which is stable in the processing baths and forms with bases salts soluble in organic solvents, and the etching solution contains a base that ionizes the colorant, and a solvent for the resulting ion pair.

10 Claims, No Drawings

SYSTEM FOR THE PRODUCTION OF DOT-ETCHED LITHOGRAPHIC FILMS

DESCRIPTION

TECHNICAL FIELD

This invention relates to a system for the production of dot-etched lithographic films consisting essentially of a light sensitive material for tanning development and an etching solution.

BACKGROUND ART

Photomasks, which contain image areas opaque to actinic radiation are known in the field of photographic reproduction as originals for use in the imagewise exposure of light sensitive material, for example for the production of color separations, printing plates, etc.

Silver halide films, known as "litho films" are used for the preparation of halftone photomasks in which the image is formed of dots of various sizes. It is often necessary for the tonal values of the developed silver image to be corrected. For this purpose, the halftone dots are reduced by a dot etching process, in which the silver present in the exposed image areas is partially removed oxidatively by a silver dissolving agent. A disadvantage of this type of silver halide film is its high silver coating weight and consequently, its high production cost.

It is known that exposed photographic materials, which contain an unhardened or only slightly hardened silver halide/gelatin emulsion layer, can be hardened imagewise with tanning developers. The tanning developer oxidation products produced by development in the exposed image areas have the property of hardening gelatin, In the unexposed image areas Where development does not occur, there is no hardening and therefore, these image areas can either be washed off with the formation of a relief image or transferred wholly or partially onto an image receptor. The addition of pigments or dyes, particularly carbon black, to the light sensitive material is known, in order to confer adequate optical density to the image areas. This makes it possible to use less silver halide than is needed for image production. These wash-off films are described, for example, in the following patents and patent application: U.S. Pat Nos. 2,596,756, 3,364,024, 3,440,049, 4,233,392, 4,369,245, 4,427,757 and 4,504,572 and Bristish Patent No. 1,294,355.

An important disadvantage of the wash-of films for tanning development, compared to (conventional) silver halide films, is their lack of wet etchability, which limits significantly their use in reprography. This applies particularly in the preparation and reproduction of color separations for multicolor printing.

In principle this problem should be solvable by the use of materials with colloidal silver as the image-forming pigment, as are described, for example, in European Patent Application EP 01 95 327. because such films should be etchable by the conventional methods. However, the use of such films involves serious technical process concerns, because, as unhardened film areas are washed off, silver enters the wash water, Solving this Problem involves not only high technology but is expensive. Another disadvantage is the higher film material cost, which results from the higher price of the silver pigment compared to other pigments.

Many other pigments and dyes are unsuitable, because they affect adversely the imaging ability of the silver halide or the tanning process. Compounds that tend to crystallize or "bloom" in the film layers are not suitable as pigments or dyes. This also applies to materials that are bleached by the action of the processing baths or are dissolved out of the film layer. However, it should be possible, after processing, to bleach or partially remove the pigments or dyes from the film, if desired, to achieve a reduction of the halftone dots. A dot reduction without a decrease in optical density is most desirable. In addition, the mechanical stability of the film should remain unchanged, and the film should not be stained by the eliminated pigments or dyes.

Therefore, the present invention is directed to a system for the preparation of dot-etched lithographic films that contain pigments other than silver and that do not adversely affect the advantages of wash-off film systems, such as low silver coating weight and fast, automatic processing,

SUMMARY OF THE INVENTION

In accordance with this invention there is provided a system for the preparation of dot-etched lithographic films, consisting essentially of a light sensitive material for tanning development and an etching solution, in which system the light sensitive material, comprising
  (a) a support,
  (b) at least one unhardened or substantially unhardened gelatin layer containing at least one colorant.
  (c) a tannable, gelatin cover layer applied directly over layer (b),
  (d) light sensitive silver halide, contained in at least one of the layers specified in (b) and (c), is treated, after imagewise exposure, development and removal of the unexposed areas, with an etching solution to reduce the halftone dots, the improvement wherein
    (1) the at least one colorant used contains at least one acid group is stable in processing baths and forms with bases salts soluble in organic solvents, and
    (2) the etching solution is aqueous and contains at least one base that ionizes the colorant and at least one organic solvent for the resultant ion pair.

In accordance with an embodiment of this invention there is provided a process for the preparation of dot-etched lithographic films in which a light sensitive material, comprising
  (a) a support,
  (b) at least one unhardened or substantially unhardened gelatin layer containing at least one colorant.
  (c) a tannable, gelatin cover layer applied directly over layer (b) in which material at least one layer contains silver halide,
is exposed imagewise to an image containing halftone dots and developed, the unexposed areas are removed and the film is treated with an aqueous etching solution to reduce the size of the halftone dots, the improvement wherein
  (1) the at least one colorant used contains at least one acid group, is stable in processing baths and forms with bases salt soluble in organic solvents, and
  (2) the aqueous etching solution contains at least one base that ionizes the colorant and at least one organic solvent for the resultant ion pair.

EMBODIMENTS OF THE INVENTION

Colorants, e.g., pigments or dyes within the scope of the invention are those that contain at least one acid group, are stable in the processing baths and form with bases salts soluble in organic solvents. Their pKa value should lie preferably between 10 and 14. Typical examples of such groups are phenolic bonded hydroxy groups preferably in the position alpha to an azo group and enolic bonded hydroxy groups, as in derivatives of acetoacetic acid, etc. Especially preferred compounds of this type are Red Pigment 3 (C.I. 12120), Red Pigment 112 (C.I. 12370), Yellow Pigment 74 (C.I. 11741), Orange 5 (C.I. 12075) and Sudan Orange 220 (C.I. 12055).

The colorants are present in the film before processing. They are added as aqueous dispersions to the silVer halide emulsion and coated together with all other components. The particle size of the colorants should be less than the thickness of the colorant-containing layer, preferably in the submicron area of 0.2 to 1 $\mu$m.

The layer containing colorant can also contain fillers or other additives. The colorant, e.g., pigment, can be pretreated with coating or dispersing agents. The colorant/binder ratio can lie between 3:1 and 1:10. the range between 2:1 and 1:3 being preferred.

The use of a cover layer over the layer containing the colorant is fundamental to the system of the invention for the preparation of dot-etched lithographic films. This cover layer consists essentially of, and in the simplest case, exclusively, gelatin, As a result of the tanning reaction, this layer is stable imagewise and limits the surface attack of the etching solution to promote etching action on the edges of the dots and consequently, dot reduction, with the optical density being retained. The dry coating weight of this layer can be between 0.3 and 1.5g gelatin/m$^2$. In addition, additives, such as polyethylene waxes silica, etc., can be included. To minimize swelling, this layer can contain a small quantity of hardener. e.g. chrome alum, etc.

The simplest embodiment of a film suitable for the system of the invention is the two layer structure with a colorant layer on the support and a cover layer over the pigment layer. However, preferred film structures contain, in addition to the above-named layers, additional auxiliary layers, for example, an additional overcoating. The light sensitive emulsion can be present, as desired, in one or more layers. Suitable silver halides are primarily silver chloride, silver bromide or their mixtures and also their mixtures with silver iodide, The light sensitive emulsion can be sensitized chemically and/or spectrally by any sensitizer or sensitizing technique. Other additives, such as antifoggants, wetting agents, etc., can similarly be present in the emulsion.

Many tanning developers suitable for image production are known in the literature. The polyoxy compounds of benzene, naphthalene or diphenyl, which can be substituted in the nucleus with halogen or alkyl and aryl groups, are cited in this connection. The polyhydroxy-spiro-bis-indane compounds described in U.S. Pat. No. 3,440,049, the disclosure of which is herein incorporated by reference, are particularly suitable. The tanning developer agents can be added to one or more layers of the light sensitive structure, but can also be present in the processing baths. In an especially preferred version, the light sensitive structure contains the tanning developer agent in an additional overcoating.

Films suitable as a support in a system of the invention include the transparent or opaque materials known for this purpose. Papers glass, sheets or non-woven structures of natural or synthetic polymers are particularly cited. Polyethylene terephthalate, for example, is a preferred support.

For image production, the photographic material is exposed through a transparency, developed and finally washed off imagewise. If the tanning developer agent is wholly or predominantly contained in the developer solution, the known tanning developer solutions, which contain, in addition to the tanning developer agent, an alkali compound. preferably an alkali mixture as an essential component, can be used.

The baths can obviously contain other known additives, such as, for example, wetting agents, sequestrants and antioxidants. If the developer agent is contained in the photographic layer an alkaline activation bath is used for development. Suitable alkalis for the preparation of such activator solutions are alkali carbonates and alkali hydroxides, as well as the knoWn carbonate and phosphate buffer systems. Washing off the unhardened image areas is performed preferably by spraying with warm water of at least 30° C.

Suitable etching solutions for the system of the invention consist essentially of at least one water-miscible, polar solvent or solvent mixture a strong base and water. The composition of the etching solution is adapted to the colorant e.g., pigment or dye used. The solvent or solvent mixture can consist of materials such as alcohols, ethers, lactones, ketones, etc. A mixture of ethanol and acetone has been shown to be especially effective hydroxide especially potassium hydroXide is preferred as the strong base, but the use of other bases is possible.

The etching step can be controlled by the composition of the etching solution. The speed can be increased for example, by an increase in base proportion or solvent. e.g., alcohol, content.

The etching process is performed in the known manner by immersing the film material in the etching solution at room temperature or by applying the solution with a brush. The process is stopped by rinsing the film with water. The etching process can be repeated a number of times. The colorant(s) dissolved out of the film by water can be separated from the used etching solution by dilution or acidification.

The system of the invention combines in an ideal fashion the advantages of wash-off fi)ms for tanning development and conventional silver salt films. With this system which is used in reprography, particularly for the Preparation of color separations and contact copies, it is possible to reduce halftone dots on wash-off films for tanning development after their processing without adversely affecting the advantages of such wash-off films, such as low coating weight, rapid processing, etc. Dot reduction is achieved without optical density being diminished. In addition, the mechanical stability of the films is not impaired during and after processing.

EXAMPLES

The invention is explained in more detail by the following examples, without, however, being limited thereto.

Example 1

The following coating solutions were prepared for the production of light sensitive materials for tanning development

Coating Solutions I a-e

A chemically ripened, Lippmann type silver chloride emulsion containing 160 g gelatin per mole silver was mixed with an aqueous pigment dispersion. which, in each case, contained one of the following pigments:
- (a) Orange 5 C.I. 12075
- (b) Red Pigment 112 C I. 12370
- (c) Red Pigment 3 C.I. 12120
- (d) Sudan Orange 20 C.I. 12055
- (e) Yellow Pigment 74 C.I. 11741

Each was adjusted to a pigment to silver weight ratio of 2.5:1.

Coating Solution II was a 7.5gelatin solution, which in each case contained 0.1% wetting agents of the alkylaryl sulfonate and PEO alkyl ether type.

The following contact films were prepared by applying coating solution I on a 100μthick polyethylene terephthalate base and optionally, coating solution II over coating solution I:

| Film | Coating Solution |
| --- | --- |
| 1 | I a |
| 2 | I b |
| 3-7 | I a + II to I e + II |

In all cases, the silver coating weight was 0.6 g/m$^2$, the gelatin coating weight of the second layer (coating solution II), 0.9 g/m$^2$. All films were provided With en overcoat, as described in Ciskowski U.S. Pat. No. 4,456,676, Example 1, containing 3,3,3',3'-tetramethyl-5,6,5',6'-tetrahydroxyspiro-bis-indane.

After the coatings were dried, samples of the resulting films were exposed, in contact with a halftone transparency, to a mercury vapor lamp providing 10 mj/cm$^2$. Elements of the transparency were fields of 30%, 50% and 70% halftone dots with a screen width of 60 lines/cm.

The exposed films were processed as described in U.S. Pat. No. 4,456,676. Sharp negatives of the transparency were obtained with tonal values of 73%, 52% and 32%.

Samples of the resulting negatives were half covered with adhesive strips and immersed in etching solutions of the following compositions:

|  | Solution I | Solution II | Solution III | Solution IV |
| --- | --- | --- | --- | --- |
| Water | 20% | 20% | 20% | 30% |
| Ethanol | 76% | 76% | 60% | 66% |
| Acetone | — | — | 16% | — |
| NaOH | 4% | — | — | — |
| KOH | — | 4% | 4% | 4% |

The temperature of the solutions was 25° C.

A timing sequence was established by which the samples were treated 1' (or 0.5'), 2' and 3'.

The treatment of the samples with the etching solutions was stopped by rinsing the samples with water. Then the samples were dried, the adhesive strips removed and the samples copied on duplicating film. The tonal values on the copy were measured in the covered and uncovered areas and the differences determined. The results are compiled in Table 1 below, giving the average value of the tonal value changes (α) on the 73%, 52% and 32% dots. Dotted lines in the table indicate that there was no copiable density present.

TABLE 1

Tonal Value Change Δ in % by Action of the Etching Solution

| Film | Time | Etching Solution I | II | III | IV |
| --- | --- | --- | --- | --- | --- |
| 1 | 1' | 2 | 2 | — | none |
|  | 2' | — | — | — | 2 |
|  | 3' | — | — | — | — |
| 2 | 1' | none | none | 2 | none |
|  | 2' | — | — | — | 2 |
|  | 3' | — | — | — | — |
| 3 | 1' | 2 | 2 | 3 | none |
|  | 2' | 3 | 3 | 4 | 2 |
|  | 3' | 4 | 4 | 6 | 4 |
| 4 | 1' | 2 | 2 | 4 | 2 |
|  | 2' | 4 | 4 | 5 | 2 |
|  | 3' | 5 | 5 | 7 | 4 |
| 5 | 1' | 3 | 3 | 6 | 2 |
|  | 2' | 5 | 6 | — | 5 |
|  | 3' | — | — | — | 5 |
| 6 | 0.5' | 2 | 2 | 5 | none |
|  | 1' | 5 | 5 | — | 3 |
|  | 2' | — | — | — | 5 |
| 7 | 1' | none | none | 2 | none |
|  | 2' | none | none | 3 | none |
|  | 3' | none | none | 4 | none |

If the test results with films 1 and 2 are compared with those of the other tests, it is seen that, without an overcoating on the pigmented layer, the halftone dots do not have an aptitude for dot size reduction and no copiable densities are present even after short treatment with the etching solution. However, with an overcoating, the halftone dots can be reduced without reducing the original density. Film 7 contains a pigment of the acetoacetic ester type. Because the enolic hydroxy groups have a lower acid strength than the phenolic hydroxy groups in the other pigments, it is understandable that, under the same conditions the etching effect on Yellow Pigment 74 is less than on naphthol azo pigments. However, by modification of the etching solution, the etching effect can be increased on this pigment as is shown with the use of etching solution III.

EXAMPLE 2

An aqueous dispersion of Red Pigment 112 was added to a chemically and spectrally sensitized silver halide emulsion (Cl$^-$:Br$^-$=70:30) containing 80g gelatin per mole silver so that the mixture contained 1.5parts by weight pigment to one part by weight silver.

A second coating solution corresponded to coating solution II of Example 1 was prepared.

A camera-sensitive film was prepared by applying the two coating solutions in the two-layer coating process on a 100μ polyethylene terephthalate film base with an emulsion coating weight of 1.1 g Ag/m$^2$ and a gelatin coating weight of 0.9 g/m$^2$ in the superimposed layer from coating solution II. These were covered by an overcoating as described in Example 1 and containing the developer cited therein. Samples of this film were exposed through a Kohinoor screen for line films, so that 50% to 70% halftone dots were produced on the film. The samples were developed as described in Example 1. Halftones with high dot sharpness were obtained. Samples were cut from the resulting halftone negatives and half coVered. The samples thus prepared were etched in etching solution III of Example 1, as there described, and recopied. The tonal value differences on the copy between the covered and uncovered image areas averaged 28% after 3 minutes etching.

I claim:

1. System for the preparation of dot-etched lithographic films, consisting essentially of (1) a light sensitive material for tanning development, and (2) an etching solution, in which system the light sensitive material comprising
   (a) a support,
   (b) at least one unhardened or substantially unhardened gelatin layer containing at least one colorant, containing at least one acid group, the colorant being stable in developers and forming with bases salts soluble in organic solvents,
   (c) a tannable, gelatin cover layer applied directly over layer (b),
   (d) light sensitive silver halide, contained in at least one of the layers specified in (b) and (c), and
   the etching solution (2) is aqueous and contains at least one base that ionizes the colorant and at least one organic solvent for the resultant ion pair.

2. System according to claim 1 wherein dissociation constants of the at least one colorant are between $10^{-10}$ and $10^{-14}$.

3. System according to claim 1, wherein the at least one colorant contains at least one phenolic or enolic hydroxy group.

4. System according to claim 1, wherein the bases used in the etching solution are selected from the group of alkali hydroxides.

5. System according to claim 1, wherein the organic solvents used in the etching solution are polar solvents miscible with water.

6. System according to claim 1 wherein the colorant is a pigment.

7. System according to claim 1 wherein the colorant is a dye.

8. System according to claim 1 wherein the cover layer consists essentially of gelatin.

9. System according to claim 1 wherein the light sensitive material contains at least one additional auxiliary layer.

10. System according to claim 9 wherein the auxiliary layer is present over the cover layer and contains a tanning development agent.

* * * * *